March 29, 1966 P. SCHNITZLER 3,243,732

SEMICONDUCTOR CIRCUITS EXHIBITING N-SHAPED TRANSCONDUCTANCE CHARACTERISTIC UTILIZING UNIPOLAR FIELD EFFECT AND BIPOLAR TRANSISTORS

Filed Feb. 19, 1963

INVENTOR.
PAUL SCHNITZLER

BY John V. Regan

ATTORNEY

3,243,732
SEMICONDUCTOR CIRCUITS EXHIBITING N-SHAPED TRANSCONDUCTANCE CHARACTERISTIC UTILIZING UNIPOLAR FIELD EFFECT AND BIPOLAR TRANSISTORS

Paul Schnitzler, New Brunswick, N.J., assignor to Radio Corporation of America, a corporation of Delaware Filed Feb. 19, 1963, Ser. No. 259,572
4 Claims. (Cl. 332—44)

This invention relates to semiconductor devices, and more particularly to a composite semiconductor device which exhibits a nonlinear characteristic.

Semiconductor devices which exhibit a nonlinear characteristic are widely utilized as mixers, analog multipliers, modulators, and the like.

It is an object of this invention to provide a new and improved semiconductor device which exhibits a nonlinear characteristic.

A semiconductor circuit embodying the invention includes a bipolar transistor having input, output and common electrodes and a unipolar field effect transistor having gate, drain and source electrodes. The drain and source electrodes of the unipolar transistor are coupled respectively to the output and input electrodes of the bipolar transistor. The gate electrode of the unipolar transistor is coupled through a biasing source to the common electrode of the bipolar transistor. The resulting composite semiconductor device exhibits a nonlinear transconductance characteristic in that the current flowing in an energizing circuit coupled between the output and common electrodes of the bipolar transistor is a nonlinear function of the biasing voltage applied to the gate electrode of the unipolar transistor.

The transconductance characteristic of the composite semiconductor device is substantially N-shaped and comprises first and second negative transconductance portions separated by a positive transconductance portion. Furthermore, the transition regions between the positive and negative transconductance portions each exhibit a point of zero transconductance and additionally the transition regions are substantially parabolic in shape. Such a composite device may be usefully employed in many ways.

In an embodiment of the invention, the composite semiconductor device is biased to operate about the point of zero transconductance in one of the parabolic regions and the circuit performs full wave rectification on alternating voltage waves coupled in series with the biasing voltage source.

In another embodiment of the invention, the composite semiconductor device is utilized as a balanced modulator. A source of oscillatory waves of a carrier frequency and a source of signal waves of a modulating frequency are coupled in series with a biasing source adjusted to bias the composite semiconductor device to operate about a point of substantially zero transconductance. The applied carrier and signal waves are multiplied or mixed in the nonlinear portions of the transconductance characteristic and the resultant output waves include modulated sum and difference frequency waves (i.e., upper and lower sidebands). Operation in the parabolic region prevents both carrier and modulating frequency wave components from appearing in the output, thereby providing balanced modulation.

Accordingly, it is another object of this invention to provide a composite semiconductor device which exhibits a substantially N-shaped transconductance characteristic.

It is still another object of this invention to provide a composite semiconductor device exhibiting a nonlinear characteristic which is utilized to provide full wave rectification.

It is a further object of this invention to provide a composite semiconductor device exhibiting a non-linear characteristic which is utilized as a balanced modulator.

It is still a further object of this invention to provide a composite semiconductor device exhibiting a nonlinear characteristic which may be utilized as a multiplier.

The novel features which are considered to be characteristic of this invention are set forth with particularity in the appended claims. The invention, itself, both as to organization and method of operation, as well as additional advantages and objects thereof, will best be understood by referring to the accompanying drawings and the following description, in which:

Figure 1:
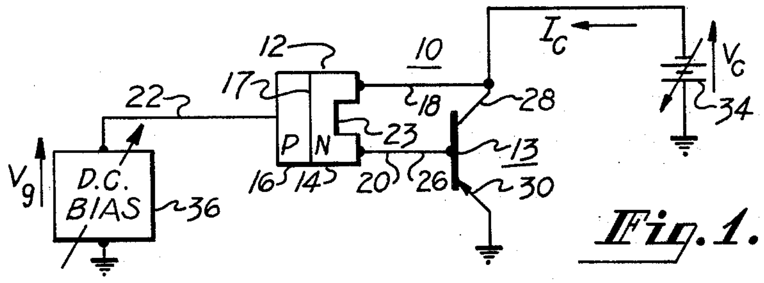
FIGURE 1 is a schematic circuit diagram of a composite semiconductor device in accordance with the invention.

Referring now to FIGURE 1, a composite semiconductor device 10 includes a unipolar field effect transistor 12 and a bipolar transistor 13. The unipolar transistor 12 comprises a first region 14 of semiconductor material of N-type conductivity and a second region 16 of P-type conductivity formed contiguous to the first region 14 so as to create a rectifying junction 17. The unipolar transistor 12 includes drain 18 and source 20 electrodes ohmically connected to opposite ends of the first region 14. A third electrode, the gate 22, is ohmically connected to the second region 16. The first region 14 is fabricated so as to be symmetrical and the drain 18 and source 20 electrodes are interchangeable. The first region 14 of the unipolar transistor 12 includes an intermediate or channel portion 23.

The bipolar transistor 13 includes input base 26, output collector 28, and common emitter 30 electrodes. The source electrode 20 of the unipolar transistor 12 is coupled directly to the input base electrode 26 of the bipolar transistor 13 while the drain electrode 18 is similarly connected to the collector electrode 28 of the bipolar transistor. The collector electrode 28 of the bipolar transistor 13, which is shown as a PNP type transistor, is coupled to the negative potential terminal of a source of D.C. energizing potential or battery 34. The positive potential terminal of the potential source 34, as well as the emitter electrode 30, are connected to a point of reference potential, or ground, in the circuit. A D.C. biasing voltage supply 36 is coupled between the gate electrode 22 of the unipolar transistor 12 and ground.

Figure 2:
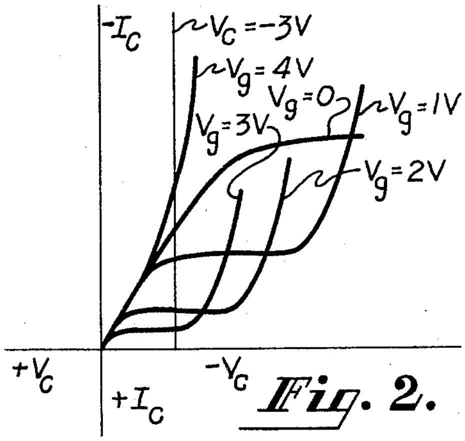
FIGURE 2 is a set of curves illustrating the current-voltage characteristics of the circuit of FIGURE 1.
Figure 3:
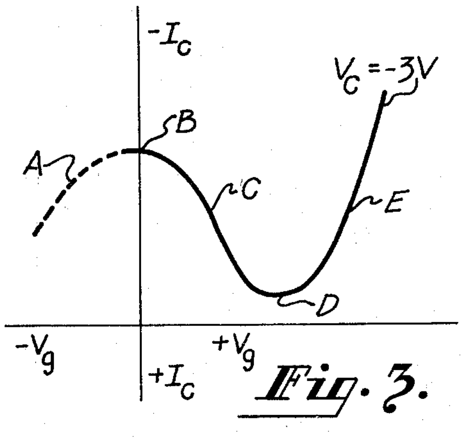
FIGURE 3 is a graph illustrating the nonlinear transconductance characteristic of the composite semiconductor device of FIGURE 1.

Referring to FIGURE 2, a series of curves which illustrate the variation of current $I_c$ flowing from the junction of the collector 28 and drain 18 electrodes of the composite semiconductor device 10 for a negatively increasing voltage $V_c$ of the source 34 is shown. Each separate curve represents a different forward biasing voltage $V_g$ varying from 0 to 4 volts and applied from the biasing source 36 to the gate electrode 22. To illustrate the nonlinear transconductance characteristic of the semiconductor device 10, a particular voltage of the source 34 (i.e., $V_c = -3V$) is selected and the transconductance characteristic is plotted therefrom. Thus, FIGURE 3 represents a transformation of the values of current $I_c$ with the bias voltage $V_g$ as the variable parameter. The dotted portion of the transconductance characteristic of FIGURE 3 is not illustrated in FIGURE 2.

It is to be noted that the transconductance characteristic as shown in FIGURE 3 is nonlinear and substantially N-shaped. There are three distinct regions in the characteristic curve. In the first region A, the dotted portion, the slope of the characteristic and thus the transconductance $g_m$ is negative. The transconductance is defined by the equation $$(1) \qquad g_m = \frac{\Delta I_c}{\Delta V_g}\bigg| V_c = \text{constant}$$

The negative transconductance does not denote a region of instability in the operation of the composite device 10 but rather indicates a phase reversal between the bias voltage $V_g$ and the overall current $I_c$. In the first region A, a reverse bias is applied from the source 36 to the gate electrode 22 of the unipolar transistor 12. When the unipolar transistor 12 is reverse biased, an insulating region or depletion layer is formed in the first 14 and second 16 regions adjacent the rectifying junction 17. The first region 14 is less heavily doped with impurities than the second region 16 so that the depletion layer penetrates more deeply into the first region 14 than into the second region 16. Substantially no current flows through the depletion layer or across the rectifying junction 17 when reverse biased. Unipolar current does flow, however, through the channel 23 between the drain 18 and source 20 electrodes and the magnitude of the current depends on the magnitude of the reverse bias. At high reverse bias voltages, the depletion layer extends completely across the channel 23 portion of the first region 14 and the unipolar transistor 12 is substantially cut off. Since the unipolar transistor 12 channel current supplies the base current for the bipolar transistor 13, the bipolar transistor 13 is also cut off at high reverse bias voltages. As the reverse bias voltage $V_g$ decreases, the resistance of the channel 23 decreases and an increased base and consequently increased collector current flows through the bipolar transistor 13. Thus, the total current $I_c$ increases in absolute magnitude as shown in FIGURE 3.

At zero reverse bias, a current peak point B is reached which is the transition between the transconductance regions A and C. The transconductance $g_m$ at point B is zero. In the transconductance region C, the biasing voltage $V_g$ of the source 36 biases the gate electrode in the forward direction. However, the current $I_c$ decreases in absolute magnitude continuously throughout this region as the voltage $V_g$ increases. The exact reason for this phenomenon is not known. However, it is thought that the result is a combination of two factors; (1) the junction 17 of the unipolar transistor 12 is believed to be forward biased along only a part, and not its entire length, at low positive values of bias voltage $V_g$, and (2) the forward bias of the base-emitter junction of the bipolar transistor 13 decreases as the bias voltage $V_g$ increases through low values of forward bias voltage. The decreasing base current of the bipolar transistor 13 at these values of forward bias voltage $V_g$ has a greater effect on the overall current $I_c$ than the current flow across the junction 17 of the unipolar transistor 12 and thus the overall current $I_c$ decreases in absolute magnitude. In the region C, the transconductance $g_m$ is positive.

At the second transition point D, the slope of the transconductance characteristic curve again changes sign and a second negative transconductance region E is exhibited by the composite semiconductor device 10. The point D is a current minimum point where the transconductance $g_m$ is again equal to zero.

In the region E, the current $I_c$ increases in absolute magnitude rapidly with an increasing positive bias voltage $V_g$. In this region, it is believed that the base-emitter junction of the bipolar transistor 13 is reverse biased and the bipolar transistor 13 is substantially cut off. However, the junction 17 of the unipolar transistor 12 is believed to be entirely forward biased. Thus, the region E denotes the normal current of a forward biased PN junction.

Figures 4, 5:
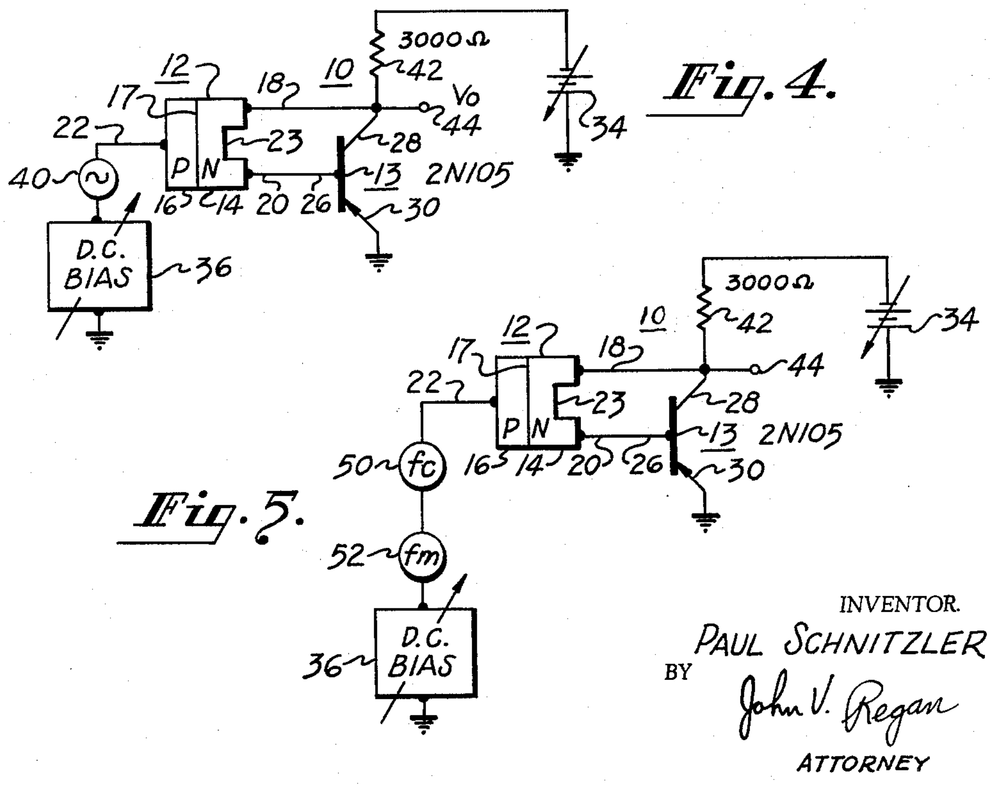
FIGURE 4 is a schematic circuit diagram of a rectifier circuit embodying the invention.
FIGURE 5 is a schematic circuit diagram of a balanced modulator embodying the invention.

The transconductance characteristic of FIGURE 3 is nonlinear and thus the composite semiconductor device 10 may be utilized as an analog multiplier, a mixer, and the like. Furthermore, since the regions A and E exhibit a negative slope, output current exhibits a phase reversal with respect to an input bias voltage $V_g$. Thus, the device 10 may also be utilized as an inverter of A.C. signals or pulse type D.C. signals. However, and perhaps more importantly, the transconductance characteristic adjacent the transition point D, as well as B, is essentially parabolic in shape. In FIGURES 4 and 5, the semiconductor device 10 is shown utilized as a full wave rectifier and as a balanced modulator respectively. In both figures the device 10 is forward biased to operate about the point D in FIGURE 3 so as to exhibit a low quiescent current $I_c$.

Referring now to FIGURE 4, wherein parts identical to those in FIGURE 1 are given identical reference numerals, the composite semiconductor device 10 is shown utilized as a full wave voltage rectifier. A source of alternating voltage waves 40 is coupled in series between the gate electrode 22 and the D.C. bias supply voltage 36. A rectified output voltage $V_o$ is developed across a load resistor 42 coupled between the negative terminal of the energizing source 34 and the junction of the collector electrode 28 and the drain electrode 18. The rectified output voltage $V_o$ is derived from an output terminal 44.

When the A.C. waves from the source 40 are of a polarity to add to the bias voltage $V_g$, the current through the load resistor 42 increases in absolute magnitude as indicated by the region E of FIGURE 3. Therefore, a positive-going voltage is derived from the output terminal 44 in FIGURE 4. Similarly, when the A.C. waves alternate in a negative direction, and subtract from the bias voltage $V_g$, the current through the load resistor 42 also increases in absolute magnitude, as indicated by the region C of FIGURE 3. Thus, both the positive and negative swings of the applied alternating waves from the source 40 produce positive voltage pulses across the load resistor 42 and therefore full wave rectification.

Referring now to FIGURE 5, a balanced modulator circuit embodying the invention is illustrated. In FIGURE 5 parts identical to those in FIGURES 1 and 4 have been given identical reference numerals. A source of oscillatory waves 50 of a carrier frequency ($f_c$) and a source of signal waves 52 of a modulating frequency ($f_m$) are coupled in series with the D.C. biasing supply 36 to the gate electrode 22 of the unipolar transistor 12.

In operation, the D.C. biasing supply 36 is adjusted to forward bias the composite semiconductor device 10 to the current minimum point D in FIGURE 3. The transconductance characteristic adjacent the point D in FIGURE 3 is substantially parabolic in shape and may be approximated by the equation $$(2) \qquad i = Kv^2$$

where $i$ represents the current through the load resistor 42, $v$ represents the instantaneous values of the alternating waves applied from the sources 50 and 52, and K is a constant depending on the composite semiconductor device 10.

From Equation 2 it is seen that the series application of sinusoidal waves of frequencies ($f_c$) and ($f_m$) produce a varying voltage at the output terminal 44 which contains components including sum and difference frequencies ($f_c \pm f_m$). However, no output waves at the carrier frequency ($f_c$) or signal frequency ($f_m$) will be produced due to the symmetry exhibited by the device 10 adjacent the point D.

Thus, the composite semiconductor device 10 functions as a balanced modulator with the extent of carrier suppression being dependent on how closely the regions C and E are symmetrical about the transition point D. The amplitude of the carrier waves from the source 50 is selected to limit the operation of the composite semiconductor device 10 to within the substantially parabolic region adjacent the transition point D. Balanced modulation is therefore provided and this avoids the necessity of supplying filters to remove the carrier waves in suppressed carrier wave communication systems or improves the suppression if filters are used.

Representative values of components for the circuits of FIGURES 4 and 5 are shown on these diagrams. The unipolar field effect transistor 12 is selected so that the channel 23 current, at the "pinch-off" voltage with a bias voltage $V_g$ of zero, is of the same order of magnitude as the operating point base current of the bipolar transistor 13 with an energizing voltage $V_c$ of $-3$ volts and a load resistor of 3K. The "pinch-off" voltage is defined as the minimum value of drain-to-source voltage of the unipolar transistor 12 at which the depletion layer extends across or pinches off the channel 23 at the drain electrode end thereof.

It is, of course, obvious that an NP unipolar field effect transistor and an NPN bipolar transistor can be readily substituted for the transistors shown in FIGURES 1, 4 and 5 without changing the operation of the circuits. Additionally, both the unipolar and bipolar transistors can be fabricated into one integrated device by known techniques rather than being separate transistors as shown in FIGURES 1, 4 and 5. Also, various known types of field effect transistors can be employed where desired, for example, a graded channel semiconductor type may be used.

Thus, in accordance with the invention, a composite semiconductor device which exhibits a nonlinear transconductance characteristic is utilized as a full wave rectifier, a multiplier or a balanced modulator.

What is claimed is:

1. An electrical circuit comprising in combination,
a composite semiconductor device having a nonlinear transconductance characteristic including first and second negative transconductance regions separated by a positive transconductance region and exhibiting zero transconductance points between said negative and said positive transconductance regions,
said composite semiconductor device including,
a field effect transistor having gate, source and drain electrodes,
a bipolar transistor having base, collector and emitter electrodes,
means coupling the drain and source electrodes of said field effect transistor to the collector and base electrodes respectively of said bipolar transistor, and
means for coupling a biasing source between said gate electrode of said field effect transistor and said emitter electrode of said bipolar transistor to bias said composite semiconductor device at one of said negative and positive transconductance regions.

2. A full wave rectifier comprising in combination,
a field effect transistor having gate, source and drain electrodes,
a bipolar transistor having base, collector and emitter electrodes,
means coupling the drain and source electrodes of said field effect transistor to the collector and base electrodes respectively of said bipolar transistor to provide a composite semiconductor device,
said composite semiconductor device having a nonlinear transconductance characteristic including first and second negative transconductance regions separated by a positive transconductance region and exhibiting zero transconductance points between said negative and said positive transconductance regions,
a biasing voltage source coupled between said gate electrode of said field effect transistor and said emitter electrode of said bipolar transistor to bias said composite semiconductor device at substantially one of said zero transconductance points,
a source of energizing potential and a load resistor coupled in series between said emitter electrode and the junction of said drain and collector electrodes,
means for applying alternating waves to be rectified to said gate electrode, and
means for deriving rectified waves from said load resistor.

3. A multiplier comprising in combination,
a field effect transistor having gate, drain and source electrodes,
a bipolar transistor having base, collector and emitter electrodes,
means coupling the drain and source electrodes of said field effect transistor to the collector and base electrodes respectively of said bipolar transistor to provide a composite semiconductor device,
said composite semiconductor device having a nonlinear transconductance characteristic including first and second negative transconductance regions separated by a positive transconductance region and exhibiting zero transconductance points between said negative and said positive transconductance regions,
a source of energizing potential and a load resistor coupled in series between said emitter electrode and the junction of said collector and drain electrodes,
a biasing voltage source coupled between said gate electrode and said emitter electrode to bias said composite semiconductor device to operate at a nonlinear point on said transconductance characteristic,
means for applying first and second electrical signals to said gate electrode, and
means for deriving output signals from said load resistor,
said output signals including the product of said first and second signals.

4. A balanced modulator comprising in combination,
a field effect transistor having gate, source and drain electrodes,
a bipolar transistor having base, collector and emitter electrodes,
means coupling the drain and source electrodes of said field effect transistor to the collector and base electrodes respectively of said bipolar transistor to provide a composite semiconductor device,
said composite semiconductor device having a nonlinear transconductance characteristic including first and second negative transconductance regions separated by a positive transconductance region and exhibiting zero transconductance points between said negative and said positive transconductance regions,
a biasing voltage source coupled between said gate electrode of said field effect transistor and said emitter electrode of said bipolar transistor to bias said composite semiconductor device to operate at substantially one of said zero transconductance points,
an energizing potential source and a load resistor coupled in series between said emitter electrode and the junction of said drain and collector electrodes,
means for applying oscillatory waves of a carrier frequency and signal waves of a modulating frequency to said gate electrode, and
means for deriving from said load resistor sum and difference frequency waves produced by the interaction of said carrier frequency and said modulating frequency waves in the nonlinear transconductance region of said composite semiconductor device.

References Cited by the Examiner

UNITED STATES PATENTS

| | | |
|---|---|---|
| 2,663,806 | 12/1953 | Darlington. |
| 2,879,482 | 3/1959 | Mathis et al. |

| | | |
|---|---|---|
| 3,026,485 | 3/1962 | Suran. |
| 3,130,377 | 4/1964 | Brown et al. |
| 3,130,378 | 4/1964 | Cook. |

HERMAN KARL SAALBACH, *Primary Examiner.*

ALFRED L. BRODY, *Examiner.*

P. L. GENSLER, *Assistant Examiner.*